(12) United States Patent
Noonan et al.

(10) Patent No.: US 7,701,218 B2
(45) Date of Patent: Apr. 20, 2010

(54) MAGNET ASSEMBLY

(75) Inventors: Paul Geoffrey Noonan, Kidlington (GB); Robert Andrew Slade, Witney (GB)

(73) Assignee: Oxford Instruments Molecular Biotools Limited, Oxon (GB)

( * ) Notice: Subject to any disclaimer, the term of this patent is extended or adjusted under 35 U.S.C. 154(b) by 0 days.

(21) Appl. No.: 11/988,665

(22) PCT Filed: May 9, 2006

(86) PCT No.: PCT/GB2006/001684

§ 371 (c)(1),
(2), (4) Date: Mar. 5, 2008

(87) PCT Pub. No.: WO2007/007022

PCT Pub. Date: Jan. 18, 2007

(65) Prior Publication Data

US 2009/0134868 A1 May 28, 2009

(30) Foreign Application Priority Data

Jul. 12, 2005 (GB) ................................. 0514303.7

(51) Int. Cl.
*G01V 3/00* (2006.01)
(52) U.S. Cl. ...................................... 324/319; 324/320
(58) Field of Classification Search .................. 324/319, 324/320
See application file for complete search history.

(56) References Cited

U.S. PATENT DOCUMENTS

| 6,515,260 | B1 | 2/2003 | Anderson |
| 6,937,020 | B2 * | 8/2005 | Munson et al. ............. 324/321 |
| 7,102,354 | B2 * | 9/2006 | Ardenkjaer-Larsen et al. ............... 324/321 |
| 7,372,274 | B2 * | 5/2008 | Ardenkjaer-Larsen et al. ............... 324/321 |
| 2008/0242974 | A1 * | 10/2008 | Urbahn et al. .............. 600/420 |

FOREIGN PATENT DOCUMENTS

| WO | WO-02/37132 A1 | 10/2002 |
| WO | WO-2004/092759 A1 | 10/2004 |

* cited by examiner

*Primary Examiner*—Louis M Arana
(74) *Attorney, Agent, or Firm*—Blank Rome LLP

(57) ABSTRACT

A magnet assembly for use in carrying out nuclear magnetic resonance experiments on a body or sample. The assembly comprises a set of superconducting coils within a cryostat, located about a bore, and arranged to generate a substantially uniform magnetic field in a primary working volume within the bore, and to generate a substantially uniform magnetic field in a secondary working volume within the coil structure and separate from the bore. At least part of a hyperpolarisation system intersects the at least one secondary working volume so as to hold a sample to be hyperpolarised in the secondary working volume.

22 Claims, 3 Drawing Sheets

MAGNET ASSEMBLY

BACKGROUND OF THE INVENTION

1. Field of the Invention

The invention relates to a magnet assembly for use in carrying out nuclear magnetic resonance experiments on a body or sample. The invention is particularly concerned with an assembly for use in carrying out liquid state nuclear magnetic resonance (NMR) measurements on hyperpolarised samples.

2. Description of Related Art

The widespread application of nuclear magnetic resonance! (NMR) has been hampered by poor sensitivity due to the very weak polarization of nuclear spins even in a strong magnetic field at room temperature (eg: $^{13}$C polarization is only 8 ppm at 9.4 T). A technique to increase the polarization of the sample by a factor more than 10000 has been disclosed by Ardenkjaer-Larsen et. al (PNAS Vol. 100, #18, p. 10158-10163, and patent application WO02/37132). This process involves hyperpolarising the sample and then dissolving it in a hot solvent, or melting it by direct application of heat, and then moving it rapidly as a liquid into a magnet where an NMR or MRI measurement is made. The <1> hyperpolarization process typically requires the sample to be cooled to a few Kelvin or below and exposed to a strong magnetic field.

A particularly versatile and effective form of hyperpolarization is Dynamic Nuclear Polarization (DNP). This involves the steps of:

mixing the sample with a source of free electrons (i.e., a free radical).

cooling the sample to typically ~1.3K in a strong magnetic field (typ. 3.35 T), at which temperature the electron spins are almost fully polarized.

irradiating the sample with microwaves near the electron paramagnetic resonance (EPR) frequency, thus causing efficient transfer of electron polarization to the nuclear spin system. This process proceeds with a time constant of tens of minutes and typically results in a polarization of 30% $^{13}$C.

thermally isolating the sample from the source of cold.

rapidly melting or dissolving the sample in hot solvent whilst still in the strong magnetic field. There is no requirement for magnetic field homogeneity during the melting phase. The sample polarization after dissolution is typically ~20%.

The final step is carried out rapidly so that the sample temperature passes through the minimum in T1 (spin-lattice relaxation time constant) rapidly and retains a significant proportion of the hyperpolarization achieved by DNP. The sample now decays with characteristic T1 This is of the order seconds for $^{13}$C, so it is advantageous to move the sample as rapidly as possible to the NMR measurement magnet. The T1 of other species (eg: proton, $^{15}$N) are much shorter, so rapid transfer is of even greater importance.

Suitable apparatus to carry out the DNP process is described in detail in the references above. It suffices to say that the required elements of the DNP polarization cell within the DNP magnet are:

a means of cooling the sample to ~1 to 1.5K, typically by immersion in a pumped liquid helium bath a means of applying low power microwave radiation to the sample a means of thermally isolating the sample from the source of cooling a means of applying heat or hot solvent to melt and/or dissolve the sample a means of transporting the sample out of the DNP cell Like NMR, DNP is a resonant technique, so the magnetic field should be uniform across the sample volume during hyperpolarization. The degree of uniformity is determined by the EPR linewidth of the free radical, and is typically of the order of a few parts per million, and no less than 100 ppm.

The apparatus disclosed in WO02/31732 uses separate superconducting magnets in separate cryostats to provide the suitable homogeneous magnetic field regions for DNP and NMR. The sample must traverse the distance between these magnets after melting/dissolution, during which time the hyperpolarization decays. The signal components arising from protonated carbons (eg: methyl groups) have shorter T1s of the order ~1 s. The distance the sample must travel between separate magnets is a few meters, which typically takes 3-6 seconds (the sample may be carried in a container or flowed down a pipe). The loss of methyl polarization is therefore of the order:

$$1-e^{(-3/1)}=95.021\%$$

It is therefore clearly desirable to reduce the distance between the DNP and NMR regions to reduce this signal loss.

BRIEF SUMMARY OF THE INVENTION

In accordance with the present invention, a magnet assembly for use in carrying out nuclear magnetic resonance experiments on the body or sample comprises a set of superconducting coils within a cryostat, located about a bore, and arranged to generate a substantially uniform magnetic field in a primary working volume within the bore, and to generate a substantially uniform magnetic field in a secondary working volume within the coil structure and separate from the bore; and at least part of a hyperpolarisation system intersecting the at least one secondary working volume so as to hold a sample to be hyperpolarised in the secondary working volume.

We have realised that it is possible to utilise regions within an otherwise conventional magnet assembly for the secondary working volume since these regions will inherently have a uniform magnetic field in view of the presence of such a field in the primary working volume.

The separate superconducting coils can be arranged in any suitable form to define a conventional NMR magnet and in some cases the secondary working volume could be located in the annular space between adjacent pairs of coils. This enables the invention to be exploited in the case of magnets that are not actively shielded or where a higher field is required for polarisation than is available between the shield coil and the main magnet coil.

A particularly advantageous arrangement, however, is to provide the set of superconducting coils so as to define an actively shielded magnet. Such a magnet has a main coil about which is provided a shield coil which carries current in the opposite sense and reduces the fringe magnetic field while providing a uniform magnetic field in the primary working volume in the bore. A typical example is described—EP-A-0144171. In this case, the secondary working volume is provided in the space between the main and shield magnets.

This is particularly advantageous since it can be used to solve a further problem, that is to increase the measurement throughput of the combined hyperpolarisation-NMR system. As mentioned, the dynamic hyperpolarization process takes typically several hours to attain $^{13}$C polarization of typically 30%. The time can be reduced by using a higher concentration of free radical or increasing the polarization temperature to ~4K, but at the expense of final polarization reached. The polarization time is the slowest part of the process and the rate limiting step for high sample throughput.

A solution is to polarize several samples simultaneously and dissolve them in a staggered fashion. A continuous throughput can be achieved by putting a new sample into each polarization cell after dissolving the last. The reduction in sample cycle time is simply the polarization time (typically 3 hours) divided by the number of polarization cells. For pharmaceutical screening applications it is desirable to achieve a sample throughput of at least four per hour, for which twelve cells would be required. It is difficult to fit such a large number of cells into the bore of the DNP magnet in the prior-art apparatus.

This problem can be solved by providing more than one hyperpolarisation system, the hyperpolarisation systems being located at respective annually spaced positions around the secondary working volume.

Although the hyperpolarised sample could be manually extracted from the secondary working volume and transferred to the primary working volume, preferably the assembly further comprises a sample transport system extending between the secondary and primary working volumes. This enables the transfer to be undertaken automatically, reducing the time required and increasing efficiency.

Typically, the sample will be transferred in a melted or dissolved form although it could also be transferred in solid form using pneumatic means or the like.

The hyperpolarisation system may be adapted to carry out any known hyperpolarisation method including dynamic nuclear polarisation, parahydrogen induced polarisation, "brute force" polarization, and optically induced polarisation.

More than one secondary working volume could be provided and/or, as explained above, more than one hyperpolarisation system could be provided in the same secondary working volume. Both these approaches enable throughput to be increased.

The uniformity required is typically 0.1 ppm over 10 mm dia×10 mm long cylindrical volume in the bore for NMR, and between 10 and 500 ppm over toroidal region with a 10-20 mm diameter cross-section between the coils for DNP. This can be improved over that achieved by the coils alone using cold or room temperature shims in a conventional manner.

Some examples of magnet assemblies in accordance with the present invention will now be described with reference to the accompanying drawings.

DETAILED DESCRIPTION OF THE INVENTION

Figure 1:
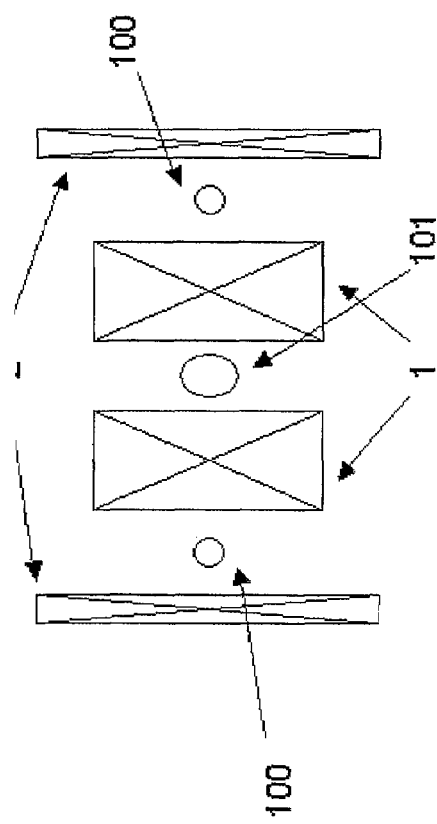
FIG. 1 is a drawing of a cross-section of a first example magnet assembly according to the present invention.

FIG. 1 illustrates the typical structure of an actively shielded magnet which in this case comprises a pair of nested solenoids with opposing current directions. The inner solenoid is the main magnet (1), and the outer is the shield coil (2).

The total amp-turns are chosen to cancel or partly cancel the total dipole moment, thus reducing the stray field of the magnet, whilst the spatial distribution of amp-turns is designed to produce a primary working region 101 of homogeneity in the bore. A secondary toroidal region 100 of homogeneity occurs because the return flux from the main magnet 1 is constrained within the annular gap to the shield coil 2.

Figure 2:
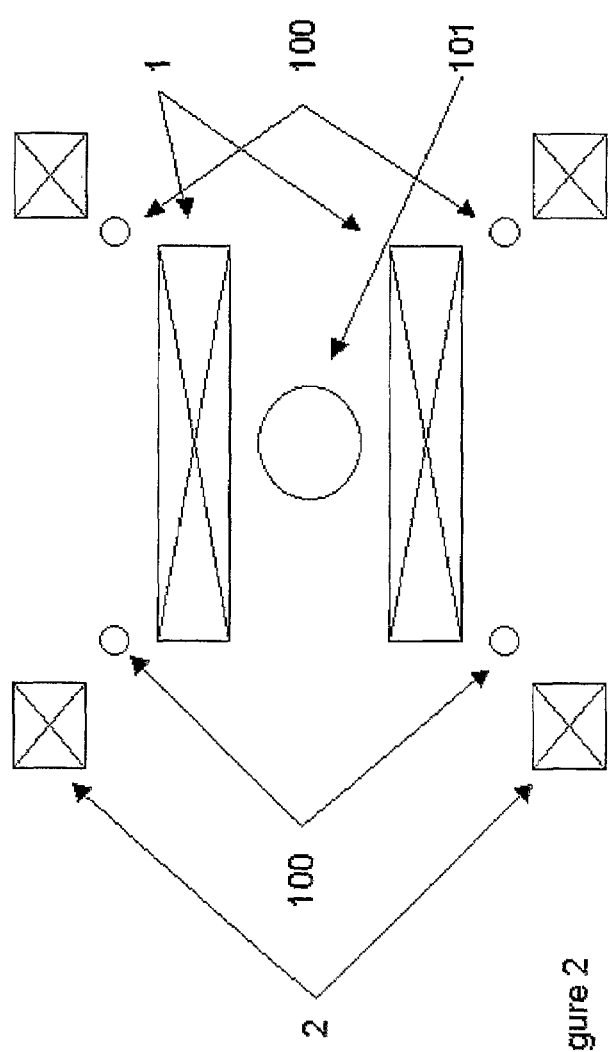
FIG. 2 is a drawing of a cross-section of a second example magnet assembly according to the present invention.

In an NMR magnet for high field spectroscopy the shield coil is typically a simple cylindrical winding (FIG. 1), whilst in a magnetic resonance imaging (MRI) magnet, it comprises typically two or more annular ring coils (FIG. 2). The invention is intended to apply equally to NMR (in-vitro) and MRI (in-vivo) applications; in the former the sample's chemical shift spectrum is analysed yielding information on chemical structure, whilst in the latter the hyperpolarized sample is typically injected into an animal or human subject located in the bore of the assembly for use as a contrast agent in imaging.

In a high field NMR magnet the main magnet 1 is typically built from a nest of concentric solenoids with graded turns density and wire type. It is, also possible to modify the magnet design to create a relatively uniform torodial region of magnetic flux between these other coils if so desired, although adjustment of the coil geometry will be required to achieve this.

Figure 3:
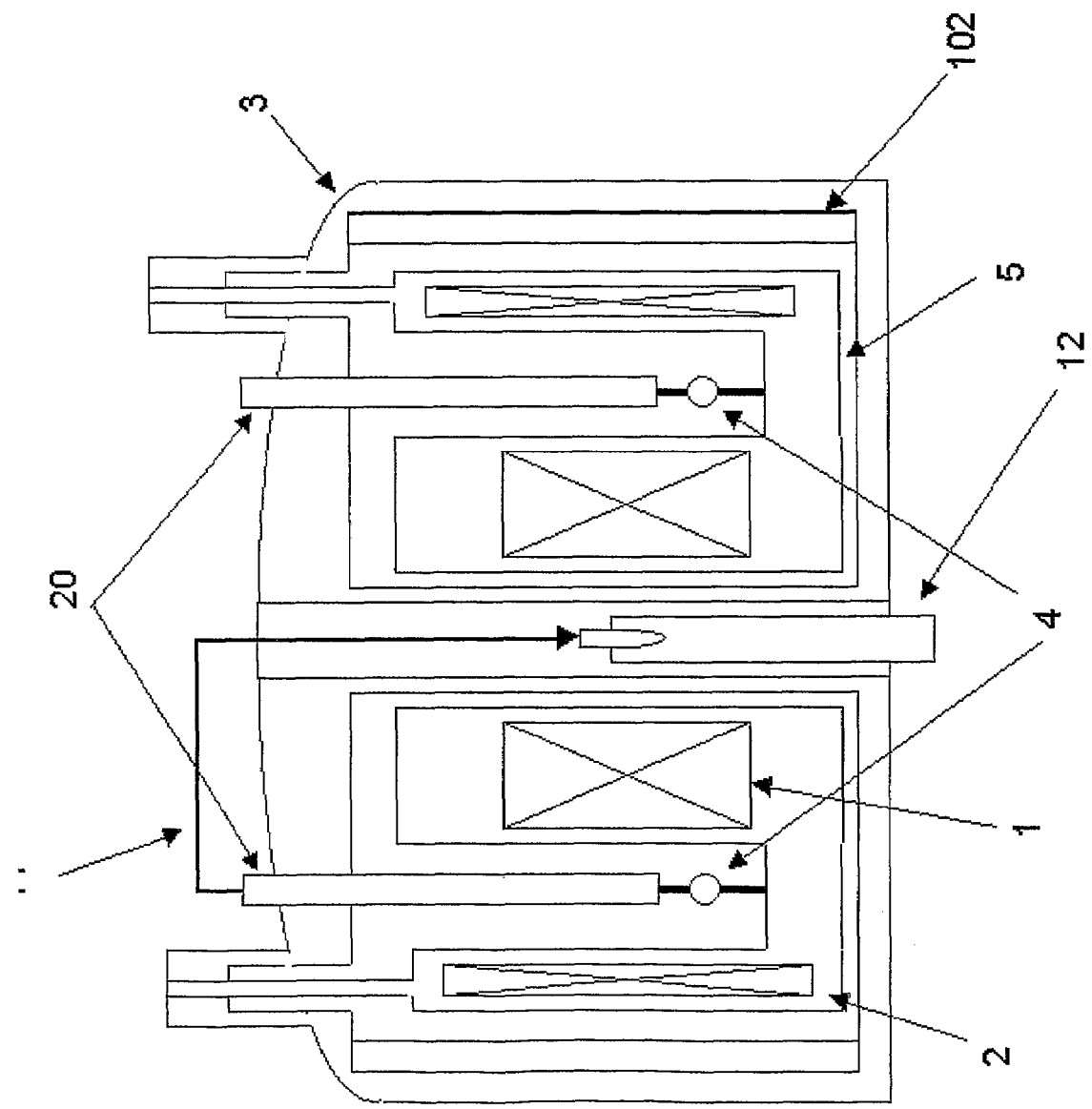
FIG. 3 is a drawing of a cross-section through a full assembly according to the present invention utilising the magnet assembly of FIG. 1.

In this example, the presence of this secondary toroidal region 100 of homogeneous field is exploited by placing one or more DNP cells in the annular space between the main magnet and active shield as shown in cross section in FIG. 3. The DNP cells 20 sit in the vacuum space inside a cryostat outer vessel 3. They are fed with liquid helium via a valve 4 from a main reservoir 5 which contains the magnet 1, 2. A pump (not shown) reduces the vapour pressure inside the DNP cell, sub-cooling the helium to ~1-1.5K. In all other respects the cryostat is a conventional NMR cryostat, possibly incorporating a nitrogen jacket 102 and/or gas cooled shields (not shown) to reduce the heat load on the main helium bath.

Figure 4:
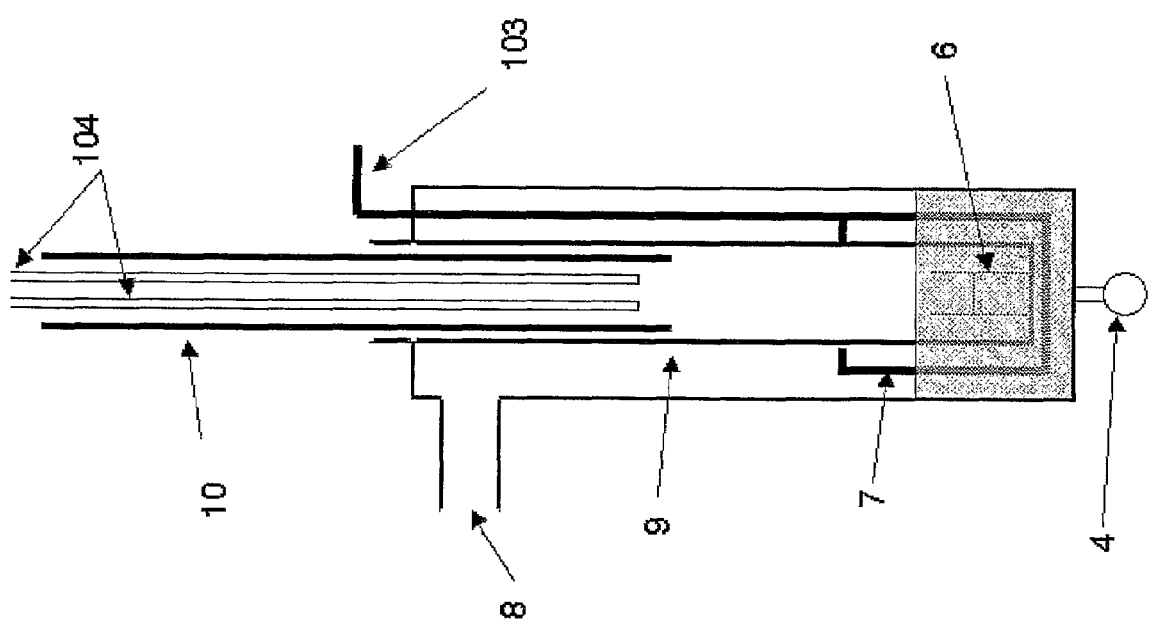
FIG. 4 is a drawing of a cross-section through a polarisation cell according to the present invention.

The construction of a typical DNP cell is shown in FIG. 4. This is only representative, and many other designs may be envisaged. The sample is placed in a cup 6 which is placed in a sample tube 9 and positioned inside a conducting, nonmagnetic microwave cavity 7. There is no requirement for the cavity to be resonant, although this may be advantageous. The cavity is fed by a suitable waveguide 103. The cell is supplied with helium via the valve 4 and cooled by pumping through a port 8. After polarization, the sample is isolated from the helium bath, typically by lifting the sample tube out of the liquid using a suitable actuator (not shown). To dissolve the sample the insert is pressurised and opened to atmosphere (using an access valve, not shown) and a "dissolution wand" 10 is inserted using a second actuator. The wand contains inlet and outlet pipes 104 through which hot solvent is flushed to dissolve and transport the sample out of the cryostat.

The sample is then rapidly pushed by pressurised gas along a pipe 11 shown in FIG. 3 into a waiting empty NMR tube inside a suitable NMR probe 12 in the main magnet 1. In a simple embodiment the solvent is heated in a closed volume until it vaporises and pressurises. Upon release it expands along the transfer pipe, dissolving the sample along the way. The distance traversed is much shorter than in the prior art, and the loss of polarization of the fast decaying signal components is therefore greatly reduced. It is possible to envisage other trajectories for the sample within the hardware described. For example, a narrow gap could be introduced at the centreplane of the main magnet, the sample being sent along a "line of sight" from DNP to NMR regions.

The magnetic flux density in the toroidal region 100 of a conventional 9.4 T actively shielded magnet (i.e., a 400 MHz proton NMR magnet) is about 1.6 T. This is likely to be entirely suitable for DNP. Alternatively the flux density may be increased to the proven value of 3.35 T by adjusting the design of the magnet.

It is straightforward to fit multiple DNP cells into the annular gap between main magnet 1 and shield coil 2. Each cell could be activated in turn delivering hyperpolarized samples into the central NMR magnet at short intervals (typically 15 minutes). In this way the DNP-NMR system will dramatically outperform a conventional NMR system in terms of sensitivity (signal-to-noise per unit time) and sample throughput for $^{13}$C direct 1D detection. The NMR probe is entirely conventional. The DNP cells can be shut down and the system used for conventional NMR if required. Any improvements that are applicable to conventional NMR hardware (e.g., pulse tube refrigerators for zero cryogen consumption, or cryogenically cooled probes) may be applied to the present invention.

An alternative to melting or dissolving the sample in the DNP magnet is to move the sample as a solid under pneumatic pressure to the NMR magnet and melt or dissolve it there. This is only feasible if the sample is kept at cryogenic temperatures (<~2K) and within a strong magnetic field (>~1 T) during the transport. The magnetic field seen by the sample in its trajectory from DNP region 100 to NMR region 101 in the magnet system described is suitable. The sample may be kept cold during the transfer by use of a suitably insulated container (eg: vacuum dewar).

The invention claimed is:

1. A magnet assembly for use in carrying out nuclear magnetic resonance experiments on a body or sample, the assembly comprising a set of superconducting coils within a cryostat, located about a bore, and arranged to generate a substantially uniform magnetic field in a primary working volume within the bore, and to generate a substantially uniform magnetic field in a secondary working volume within the coil structure and separate from the bore; and at least part of a hyperpolarisation system intersecting the at least one secondary working volume so as to hold a sample to be hyperpolarised in the secondary working volume.

2. An assembly according to claim 1, wherein the magnetic field generated in the primary working volume is stronger than the magnetic field generated in the secondary working volume.

3. An assembly according to claim 1, wherein the uniformity of the magnetic field in the primary working volume is better than 10 ppm over a 10 mm diameter×10 mm long cylindrical volume.

4. An assembly according to claim 1, wherein the set of superconducting coils define an actively shielded magnet having a main magnet around which is located a shield magnet, the secondary working volume being located between the main and shield magnets.

5. An assembly according to claim 1, wherein the secondary working volume is located between an axially spaced pair of the coils.

6. An assembly according to claim 1, wherein the secondary working volume is toroidal.

7. An assembly according to claim 1, comprising more than one hyperpolarisation system, the hyperpolarisation systems being located at respective, preferably annually, spaced positions in the secondary working volume.

8. An assembly according to claim 1, wherein the uniformity of the secondary working volume is in the range 10-500 ppm.

9. An assembly according to claim 8, comprising more than one hyperpolarisation system, the hyperpolarisation system being located at respective, preferably annually, spaced positions in the secondary working volume, wherein the uniformity is in the range 10-500 ppm over the toroidal region with a 10-20 mm diameter.

10. An assembly according to claim 1, further comprising a sample transport system extending between the secondary and primary working volumes.

11. An assembly according to claim 10, wherein the sample transport system comprises a conduit through which a hyperpolarised sample is moved in use from the secondary to the primary working volume.

12. An assembly according to claim 11, wherein a melted or dissolved sample is moved by pressurised gas through the conduit.

13. An assembly according to claim 1, wherein the hyperpolarisation system is adapted to carry out one of dynamic nuclear polarisation, parahydrogen induced polarisation, "brute force" polarization, and optically induced polarisation.

14. An assembly according to claim 1, wherein the primary and secondary working volumes are located such that a sample can be hyperpolarised in the secondary working volume while a nuclear magnetic resonance experiment is performed in the primary working volume.

15. An assembly according to claim 1, wherein the part of the hyperpolarisation system which intersects the secondary working volume is a polarisation cell.

16. An assembly according to claim 15, wherein the polarisation cell includes a microwave cavity.

17. An assembly according to claim 15, wherein the polarisation cell includes an insert cryostat suitable for cooling the sample.

18. An assembly according to claim 1, further comprising a NMR probe extending into the primary working volume.

19. An assembly according to claim 1, wherein the bore is sized to accommodate all or part of a human or animal body.

20. A method of hyperpolarising samples using an assembly according to claim 1, comprising more than one hyperpolarisation system, the hyperpolarisation systems being located at respective, preferably annually, spaced positions in the secondary working volume, wherein a plurality of samples are hyperpolarised by respective hyperpolarisation systems and then transferred sequentially to the primary working volume.

21. A method according to claim 20, further comprising supplying a new sample to each hyperpolarisation system once a previous sample has been supplied from that system to the primary working volume.

22. An assembly according to claim 1, wherein the uniformity of the magnetic field in the primary working volume is preferably 0.1 ppm over a 10 mm diameter×10 mm long cylindrical volume.

* * * * *